(12) United States Patent
Nys

(10) Patent No.: US 7,947,961 B2
(45) Date of Patent: May 24, 2011

(54) X-RAY IMAGING READOUT AND SYSTEM

(75) Inventor: Olivier Nys, Neuchatel (CH)

(73) Assignee: Advanced Silicon SA, Lausanne (CH)

( * ) Notice: Subject to any disclaimer, the term of this patent is extended or adjusted under 35 U.S.C. 154(b) by 42 days.

(21) Appl. No.: 12/604,588

(22) Filed: Oct. 23, 2009

(65) Prior Publication Data

US 2010/0104071 A1 Apr. 29, 2010

(30) Foreign Application Priority Data

Oct. 24, 2008 (EP) .................................... 08167574

(51) Int. Cl.
*H01L 27/146* (2006.01)
(52) U.S. Cl. ................................. 250/370.09
(58) Field of Classification Search ............. 250/370.09; 378/98, 98.8
See application file for complete search history.

(56) References Cited

U.S. PATENT DOCUMENTS

2001/0001562 A1* 5/2001 Orava et al. .................. 348/302
2007/0029494 A1 2/2007 Caruba et al.
2008/0180559 A1 7/2008 Yan

FOREIGN PATENT DOCUMENTS

| JP | 2004135866 | 5/2004 |
|---|---|---|
| WO | WO 9946851 | 9/1999 |
| WO | WO 02067337 | 8/2002 |

OTHER PUBLICATIONS

English language translation of abstract of JP 2004135866 (published May 13, 2004).

* cited by examiner

*Primary Examiner* — David P Porta
*Assistant Examiner* — Marcus H Taningco
(74) *Attorney, Agent, or Firm* — Thomas |Kayden

(57) ABSTRACT

An innovative readout circuit for a pixel detector, for example a solid-state X-ray pixel array, The invention includes a bank of successive approximation ADCs with a DAC in a feedback path. The integral non-linearity of the DACs and of the ADC is reduced to very low levels by providing a common resistive ladder for all the channels. In this way, the conversion law is sensibly the same for all the ADC, thus avoiding stripes or artefacts on the acquired image.

12 Claims, 13 Drawing Sheets

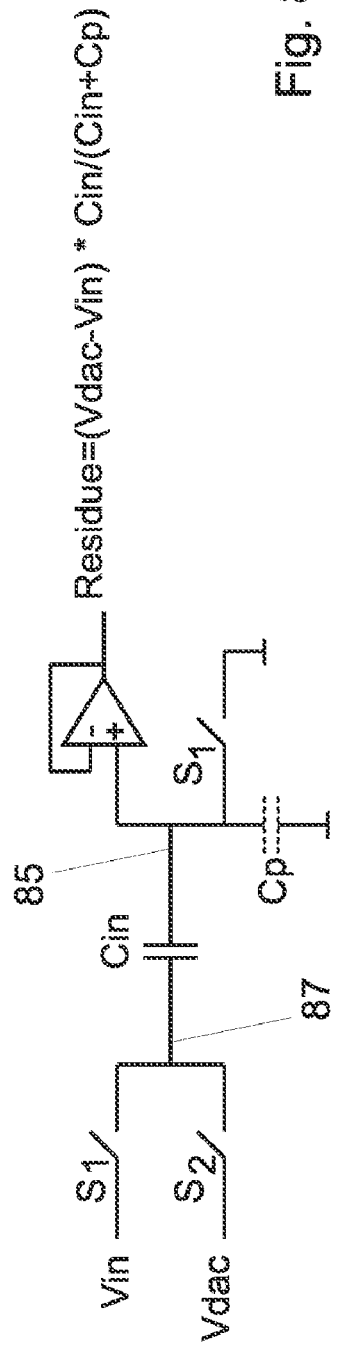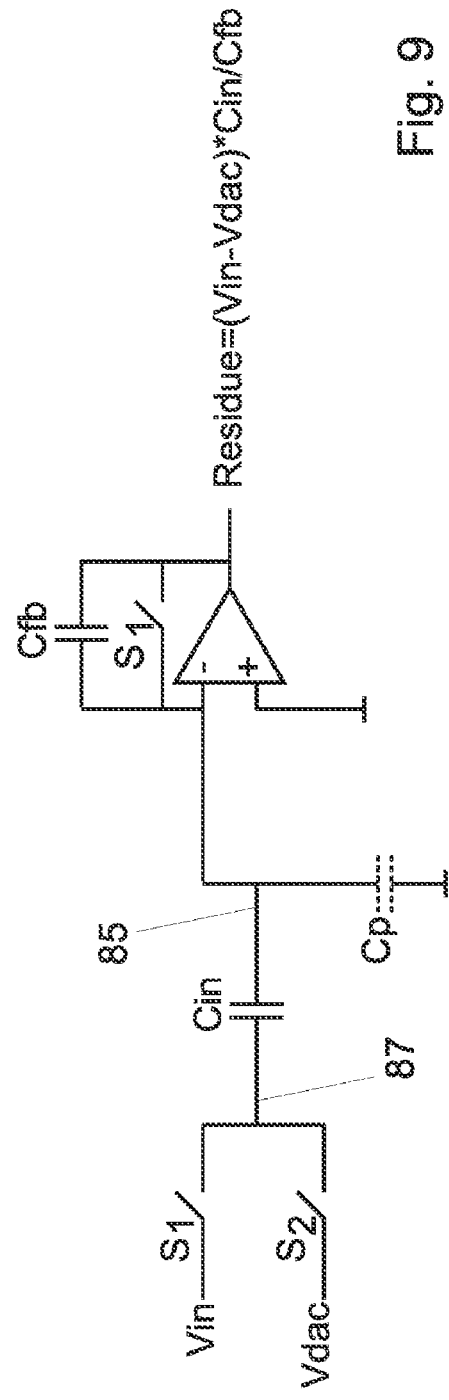

X-RAY IMAGING READOUT AND SYSTEM

This application claims the benefit of Europe application Serial No. EP08167574.6, filed Oct. 24, 2008, the subject matter of which is incorporated herein by reference.

FIELD OF THE INVENTION

The present invention relates to solid-state X-ray imaging systems and to a fast digital readout unit suitable for such a system.

DESCRIPTION OF RELATED ART

X-ray imaging is by far the most important medical imaging diagnostic tool and is also widely employed in surgery, radiation therapy, and industrial non-destructive testing applications. The traditional photographic film detectors that have being used since the beginning of radiography are now increasingly being replaced by digital X-ray detectors.

A typical digital X-ray detector comprises, for example, a sandwiched panel combining a suitable scintillator layer with an addressable array of solid-state photo detectors. Characteristically a 2D photodiode/thin-film-transistor (TFT) sensor matrix based on amorphous silicon is used, in view of the large area capability of this technology. A description of such an active panel can be found, among others, in international application WO02067337. Other kind of X-ray panels are known, and included in the scope of the present invention.

FIG. 1 represents schematically a part of a known digital X-ray imaging system. After exposure to X-rays, each of the pixels 25 in the array 20 stores electric information in analogue form, for example electric charge, that depends on the received X-ray intensity. In the presented example, each pixel includes a photodiode 250, represented here as a capacitor, and a TFT switch 253. Closing a row of switches by the row addressing circuitry 30 discharges the electric information of each of the pixels in the row onto the data columns 61, from which they are read and processed in the read-out circuit 60. The read-out circuit 60 depicted in FIG. 1 comprises a separate ADC per each individual column. This disposition offers high overall data throughput, but uses up silicon space and adds to the overall cost of the system.

Another drawback of the parallel solution is that the individual parallel ADCs have necessarily to be kept simple, and may exhibit different gain, offset and nonlinearities from one channel to another. These inequalities can not always be fully corrected, and are visible as artefacts (bands or stripes) in the X-ray image. This effect is called spatial nonlinearity, which is the non linearity on the difference between two adjacent channels, after compensation of gain and offset errors of the different channels.

It is also known to provide parallel analogue front-ends to individual columns, for example parallel charge amplifiers and/or sample/holds, and multiplex the resulting analogue signals into a high-speed ADC, which can be integrated in the same ASIC as the analogue part, or separate from it. This solution has only one ADC, but this must be much faster and complex, thus counterbalancing in part this advantage. The need of fast conversion rates also limits the vertical resolution that can be achieved.

WO9946851 describes a readout circuit for an active pixel sensor array comprising several sample-and-hold circuits for storing analogue signals from pixel in different parts of the array, and a common ADC. US200810559 discloses a readout circuit for a CMOS pixel light sensor including an ADC that can be a successive-approximation ADC

BRIEF SUMMARY OF THE INVENTION

The purpose of the invention is thus to provide a readout system that exhibits a lower spatial non linearity than the device of the state of the art.

A further goal of the invention is to provide a X-ray readout system that delivers images free of spatial artifacts and has a simpler structure than other known systems.

According to the invention, these aims are achieved by means of the object of the appended claims.

BRIEF DESCRIPTION OF THE DRAWINGS

The invention will be better understood with the aid of the description of an embodiment given by way of example and illustrated by the figures, in which:

FIGS. 8 and 9 show possible structure of the analogue difference stage in the readout circuit of the invention.

DETAILED DESCRIPTION OF POSSIBLE EMBODIMENTS OF THE INVENTION

Figure 1:
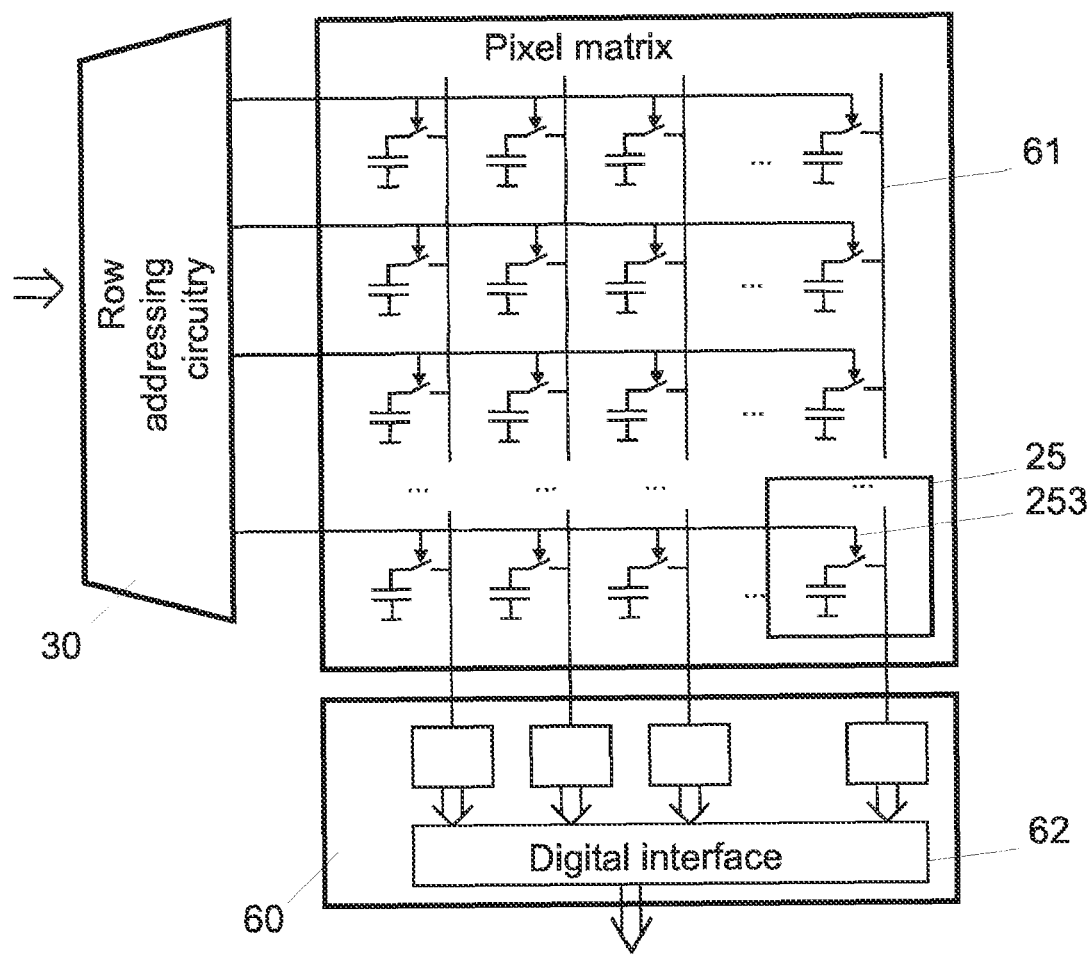
FIG. 1 shows a view of the architecture of a X-ray pixel detector and the associate readout circuit of conventional type.

FIG. 1 represents schematically the electronic general architecture of a digital X-ray detector. The actual X-ray sensitive panel includes a 2D array of X-ray sensitive pixels 25, each of which includes a solid-state detector 250, here represented by as a static capacitor, and a switch 253. One electrode of the X-ray detector 250 is connected, by the switch 253 to a column readout line 61, while the other terminal is tied to a reference potential, which can be the ground or any suitable bias voltage.

To fix the ideas we will assume in the following that the X-ray detector is a photodiode and that photodiodes and transistors are realized by an amorphous silicon TFT process. This is not, however an essential feature of the invention, which could be extended to any suitable array of X-ray detectors.

Each of the X-ray sensitive pixels 25 delivers a readout value depending on the local X-ray exposure value. In the represented case of a photodiode, the readout value takes the form of an electric charge, essentially proportional to the received X-ray exposure. Other detectors, however may provide a different electric quantity at readout, for example voltage or current, and are also included in the scope of the present invention.

Advantageously, in the represented arrangement, the single pixels function as analogue memory cells, each storing an electric charge proportional to a time-integrated X-ray intensity, The read-out circuit 60 reads sequentially the rows of pixels according to the state of the switches 253, which are set by the row addressing circuitry 30. Other readout schemes are however possible. The reference 62 designates a digital interface circuit, whose structure is not essential for the functioning of the invention and that will not be described here.

Figure 2:
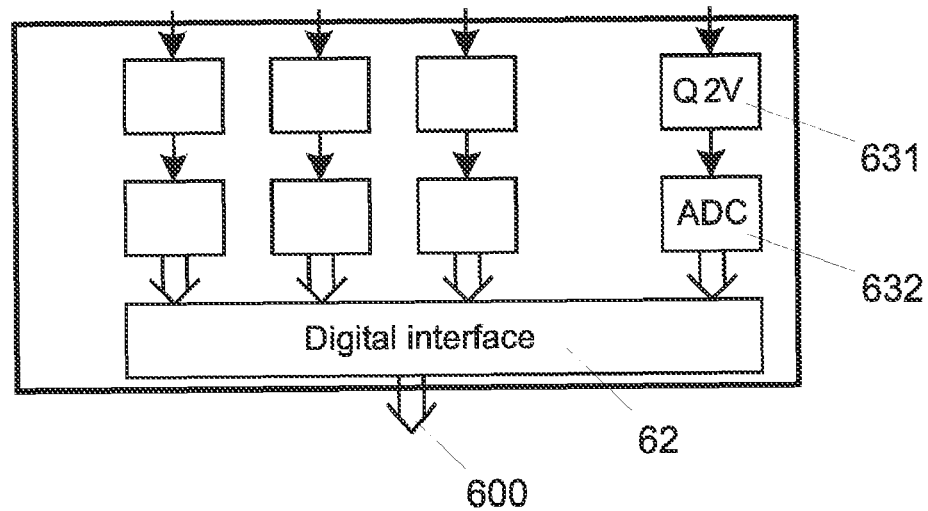
FIGS. 2 and 3 illustrate possible arrangements for the read-out interface circuit.
Figure 3:
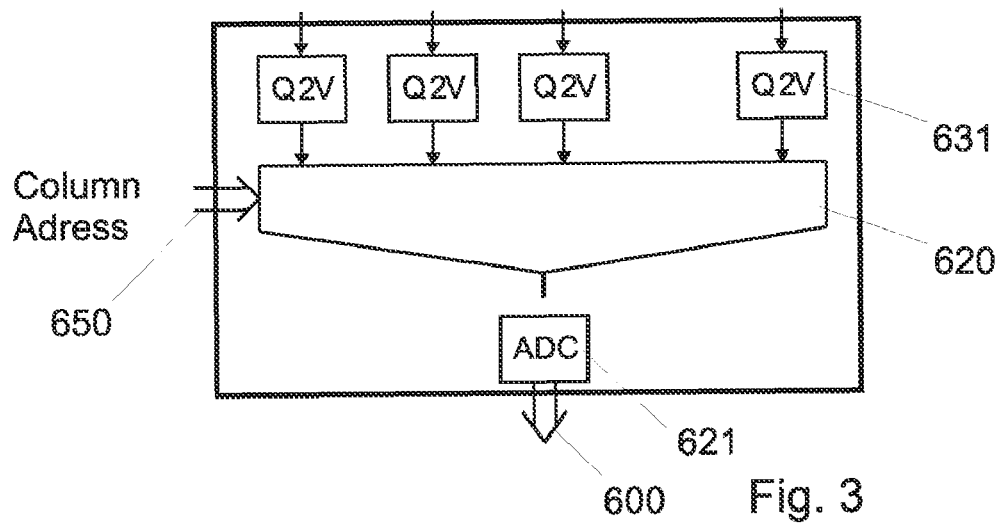

FIGS. 2 and 3 illustrate schematically two alternative dispositions of the readout circuit 60. The first variant includes a dedicated charge-to-voltage interface 631 (Q2V) and a dedicated ADC 632 for each column, so that all the columns of the X-ray detector are read in parallel. In the alternative disposition of FIG. 3, the voltage outputs are multiplexed, by multiplexer 620 in a common ADC 621, which can be in the same integrated circuit as the multiplexer and the charge-to-voltage converters, or supplied as a separate component.

Figure 4:
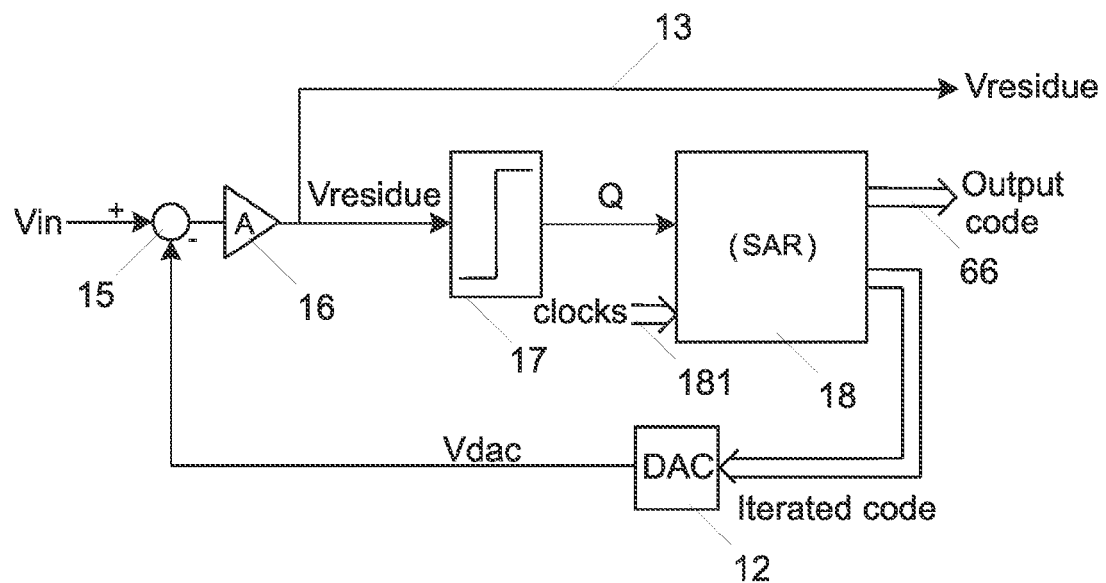
FIGS. 4 and 5 show variant arrangements of the DAC circuit of the present invention.

FIG. 4 shows schematically the functioning principle of a successive approximation ADC according to one aspect of the present invention. The ADC comprises a successive approximation register 18 designed to supply an approximate iterated code to the DAC 12, starting from the most significant bit, and iteratively determining the value of the least significant bits according, for example, to a reference clock signals 181.

The principles of functioning of successive approximations ADCs are known in the art and will be recalled here only in general terms. At the beginning of the conversion, the successive approximation register 18 is loaded with a very rough estimate of the input signal, typically, for an eight bit ADC, the conversion with start at the centre of the available dynamics, represented by code 10000000b, for example. The DAC 12 converts the iterated code into an analogue voltage that is subtracted from the input voltage yin in difference node 15. Comparator 17 detects the sign of the residual voltage and provides a digital value Q to the successive approximation register. If the residual voltage is negative, the comparator causes the successive approximation register 18 to reset the most significant bit, and set the successive bit. Otherwise, the most significant bit is left unchanged, and the successive bit is set. This is binary search continues until all the bits in the successive approximation register 18 have been tested and the output code converges to the desired representation of yin.

Figure 5:
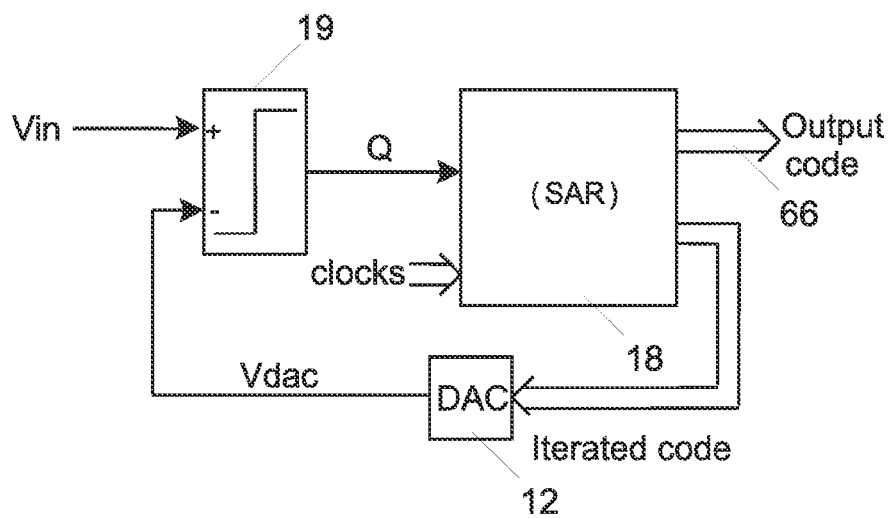

A variant of successive approximation ADC consists in replacing the difference node 16 and the single-ended comparator 17 with a two-input comparator 19, as in FIG. 5. This is then strictly equivalent to the schematic of FIG. 4, considering that the analogue difference is performed within the differential input stage of the comparator.

The algorithm given above as an example is based on dichotomy (reducing the uncertainty interval of the input signal by 2 at each step, and determination of one bit at each step). Though this is the most common implementation of a successive approximation ADC, other successive approximation algorithms are possible, and are included in the scope of the present invention. The general structure of the successive approximation ADC being that one determined by FIGS. 4 and 5 and comprising a successive approximation register producing trial codes, a DAC in feedback to reconvert back the tried code into analogue value, an analogue circuit performing the difference between input signal and DAC output in order to produce an analogue value Vresidue representative of the error on the current approximation, and a coarse ADC or a simple comparator used to estimate this error digitally in order to iteratively refine the trial code until the desired accuracy is met.

When the residual voltage is available at the output of the SAR, the input signal can in principle be determined exactly without quantization or rounding error from the output code and the Vresidue voltage.

Indeed, considering FIG. 4, $$V_{residue} = A(V_{in} - V_{dac}(\text{code}))$$

And thus the input signal can be estimated as:

$$V_{in} = V_{dac}(\text{code}) + V_{residue}/A,$$

where A represents the gain of stage 16, and $V_{dac}$ stands for the analogue value present at the output of DAC 12.

Figure 6:
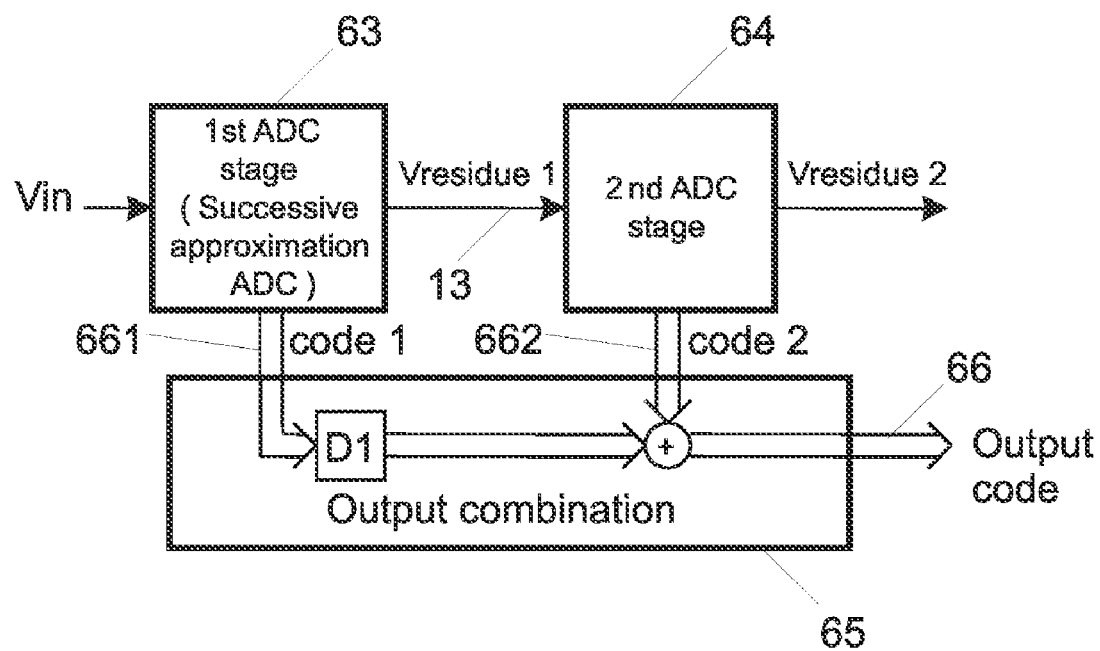
FIG. 6 represents schematically a charge-voltage conversion circuit according to an aspect of the present invention.

Thus $V_{residue}$ represents not only the error at each step, but also the error on the output code at conversion's end. By sampling this residue and estimating it in a next AD stage, for instance as shown in FIG. 6, a finer input signal estimation can be obtained, provided the gain A with which the error is amplified is exactly known. Indeed, in this case, the approximation error of the first stage is compensated for by being evaluated by the second stage. The remaining error is the rounding error of the second stage, which is generally far smaller, due to the amplification performed onto the residue.

More in detail, the ADC of FIG. 6 includes a first ADC stage 63 that is preferably a successive approximation ADC producing a digital code 661 and an analogue residual voltage 13. The residual voltage is encoded by a second ADC stage 64, producing a second digital code 662, representing the quantization error $V_{code1} - V_{in}$. A digital combination unit 65 performs the necessary arithmetic and produces a refined output code 66.

Figure 7:
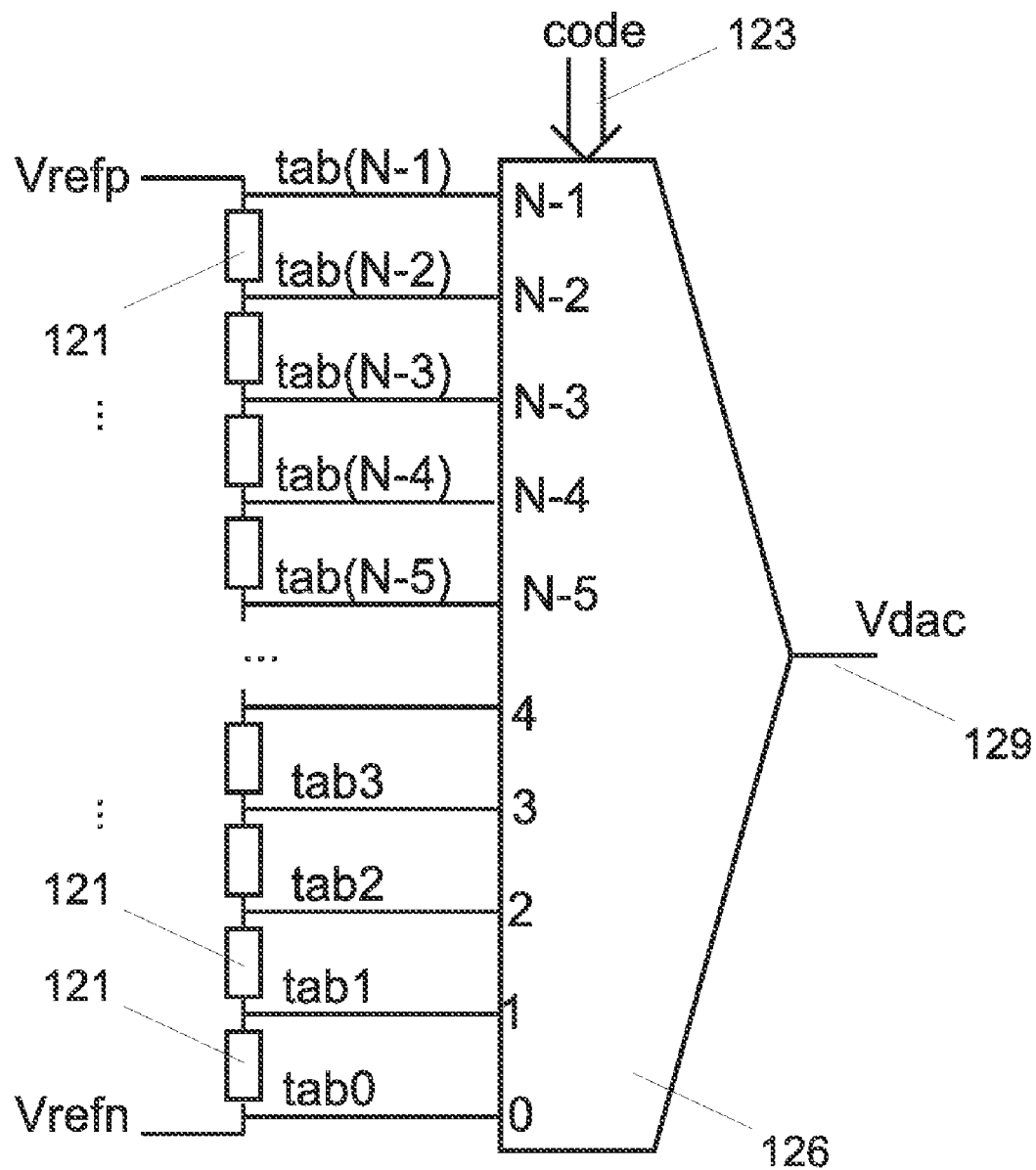
FIG. 7 shows the structure of a thermometer-type DAC used in the present invention.

The linearity of the successive approximation ADC is mainly determined by the feedback path, thus by the linearity of the DAC 12, and by the precision of the analogue difference circuit 15 of FIG. 4. It is thus advantageous to have a very linear and monotonic DAC, that is a DAC exhibiting a very small differential non linearity. Excellent differential linearity can be obtained by thermometer-coded DACs, whose output is taken by the taps of a divider comprising a number of same-value resistors 121 (FIG. 7). In this case, the divider has as many taps as the number of input codes that the DAC can accept and the output voltage 129 is selected as the voltage of the tap addressed by the input code 123. The DAC 126 can be regarded as an analogue multiplexer. The structure of the thermometer DAC automatically ensures monotonicity, because each time the DAC input code is incremented, the output voltage is selected one tap higher, so that the output voltage increases always by one resistor's voltage drop on one elementary resistor, corresponding to 1 lsb. Giving the same value to all the resistors 121 results in a linear conversion DAC. DACs of very high linearity can also be provided otherwise.

Assuming a spread of resistors of ±1% with respect to the average value, the increase of the DAC voltage would thus theoretically be between 0.99 and 1.01 lsb, leading to a negligible differential non linearity error of 0.01 lsb.

The analog subtraction between the input signal and the DAC signal can be obtained, for example, by a switched capacitor arrangement, although other techniques are also possible. In the example shown in FIG. 8, the input capacitor Cin is precharged to Vin during a first phase in which the switches S1 are closed, and the switch S2 is open. In a second phase by inverting the state of switches S1 and S2, the node 85 at the right of Cin (right electrode of Cin) is put in high impedance state, while the node 87 connected to the other electrode of Cin (left side) is switched from Vin to Vdac, and as the voltage across the capacitor is kept constant (neglecting parasitic capacitor Cp), the voltage on the right electrode (node 85) would also change by Vdac-Vin. Since this voltage level was initialized to 0V, residue will take value Vdac-Vin. In fact, due to parasitic capacitor Cp, the voltage step applied on bottom electrode of Cin will appear attenuated by a factor Cin/(Cp+Cin), slightly below 1, due to charge redistribution between Cin and Cp, which can be a problem if the residue must be evaluated precisely in the next stage, if Cp is not precisely known.

FIG. 9 shows another example of switched-capacitor analogue difference input stage, suitable for the present invention. In this example the top electrode of the input capacitor is tied to the virtual ground input of the amplifier. By this fact the circuit is not sensitive to the value of parasitic capacitor, as the voltage across Cp is constant. During the first phase, the input capacitor is pre-charged to Vin while the feedback capacitor Cfb is discharged. At the end of first phase, first the feedback switch S1 shorting Cfb opens. From there on the total charge on virtual ground must be conserved. During the second phase, the bottom electrode of Cin is switched by S2 from Vin to Vdac. Capacitor Cin is charged to Vdac, and the charge variation Cin (Vdac-Vin) on the input capacitor will be taken up by the feedback capacitor. The output voltage of the amplifier will thus vary in the opposite direction and with a gain defined by the capacitor ratio Cin/Cfb.

Several other schematics allowing obtaining the difference between Vin and Vdac through capacitive coupling are possible, and included in the scope of the present invention, in particular other schematics which allow to compensate the offset of the amplifiers, but they will not be detailed here.

Without departing from the scope of the present invention, the analogue difference between Vin and Vdac could also be obtained by other techniques than switched capacitors.

Figure 10:
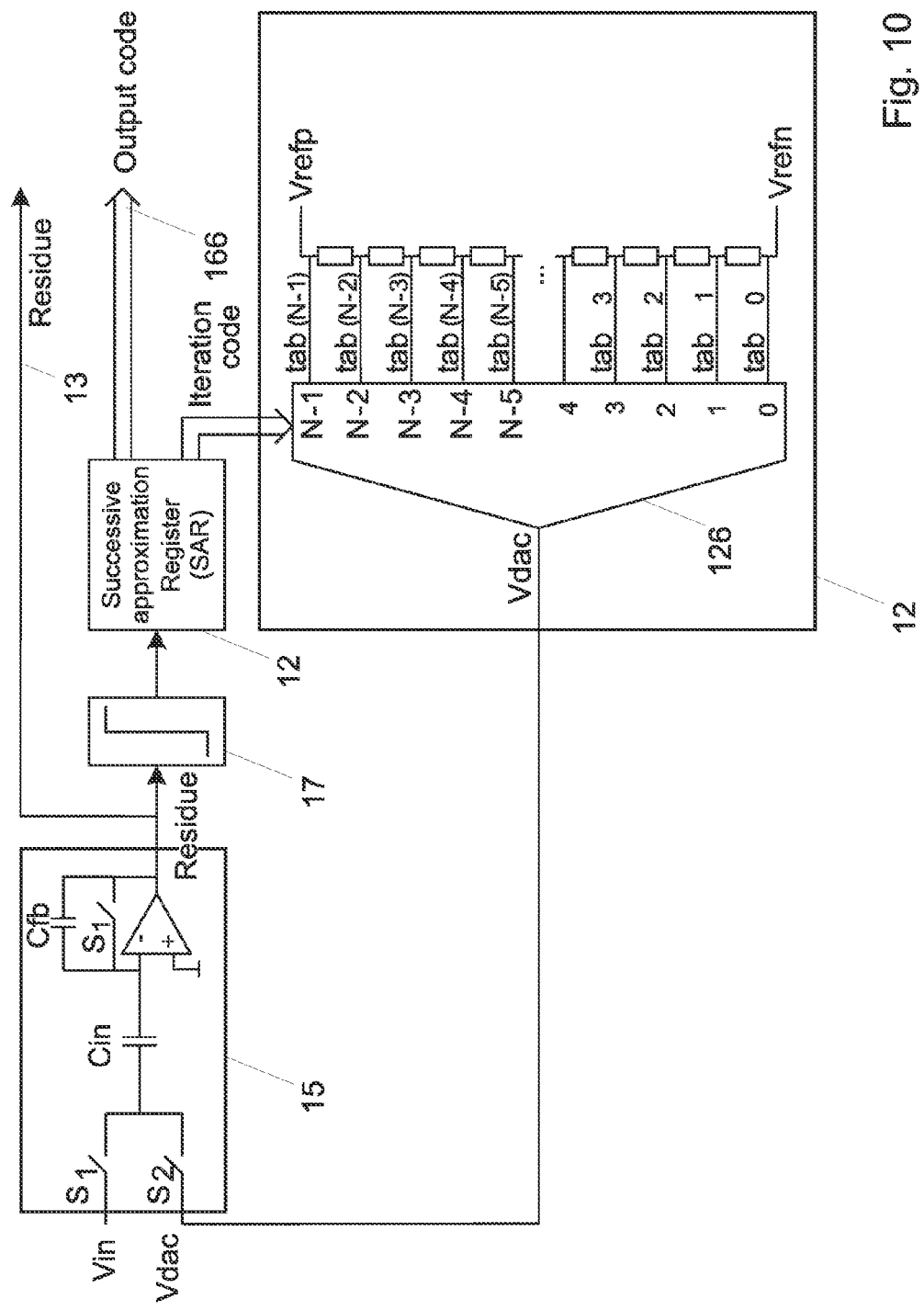
FIG. 10 shows schematically a successive approximation ADC architecture used in embodiments of the present invention.

FIG. 10 illustrates an example of a ADC unit suitable for the readout system of the present invention. This includes a difference circuit having the structure illustrated in FIG. 9, and a DAC 12 having a resistive ladder according to the structure illustrated in FIG. 7. Discriminator 17, SAR 18, multiplexer 126, output signals 13 and 66 correspond in function to the circuit elements identified by the same reference numbers in the previous figures.

Figure 11:
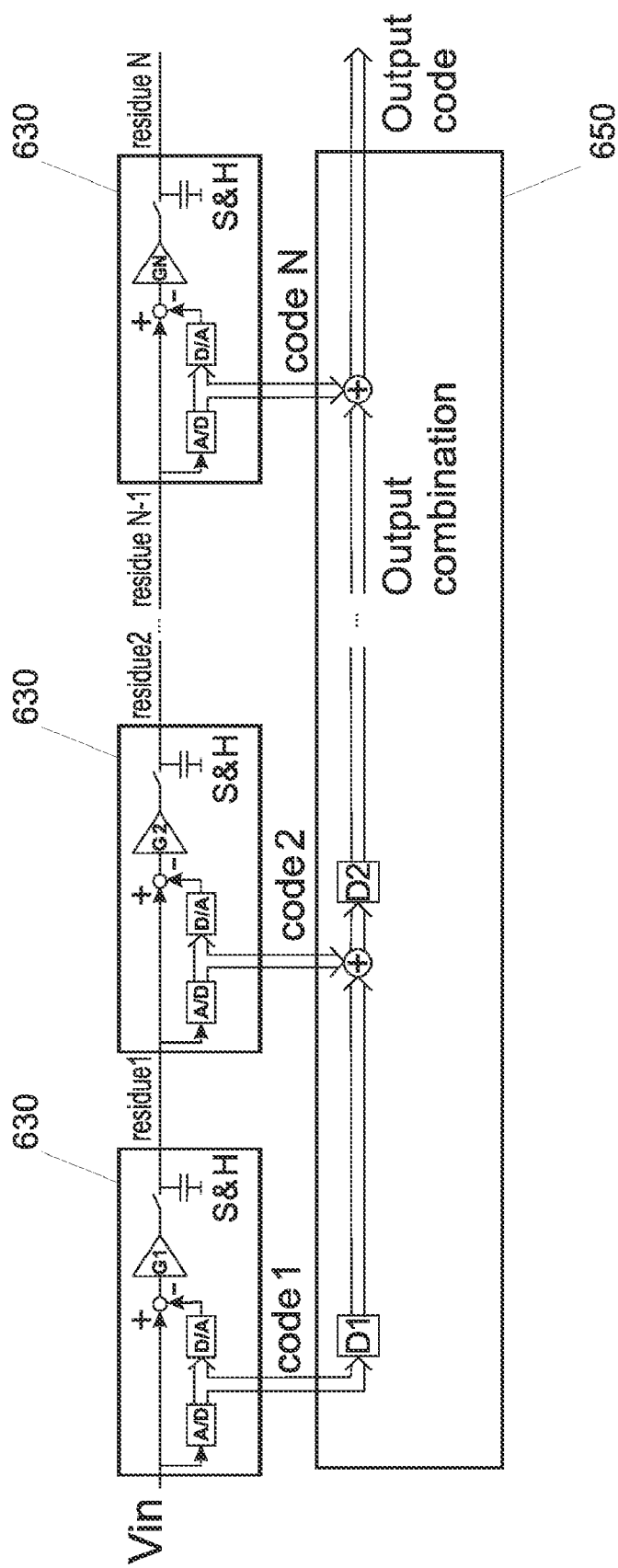
FIG. 11 represents schematically a pipeline ADC including successive approximation stages.

Referring now to FIG. 11, the readout circuit of the invention includes a multistage ADC or multistep ADC in which the conversion is performed in several steps. It is made of a cascade of several stages 630. In each stage, the input signal is sampled and converted into digital by a coarse ADC (which can also be reduced to a simple comparator). The obtained code is then reconverted back into analogue by a D/A and the DAC output is subtracted from the input signal. This difference, which is an analogue representation of the quantization error performed in the current stage, is then eventually amplified and finally stored in a capacitor by a sample and hold circuit in order to produce a residue signal which can be further processed. This residue signal is then fed to the next stage so that this one can give a digital estimate of the error performed in the previous stage. The quantization error related to each stage may then be compensated for by feeding the residue to the next stage, excepted for the last stage. The residue of the last stage is thus an image of the overall conversion error.

The output codes from the different stages are then delayed in order to compensate for the propagation time across the cascade, and combined together in output combinatory 650 in order to obtain a high resolution output code in which all the internal residue errors are compensated, at least ideally. The combination consists into a properly weighted sum of the outputs of the codes from all the stages. The number of bits of ADC and DAC within each stage can be different, the quantization within each stage can also be reduced to a simple comparison.

In the representation of FIG. 11, each step of the conversion algorithm is performed by a dedicated stage. In this case, it is called pipeline ADC. But other possibilities exist, and are also enclosed in the scope of the invention.

Figure 12:
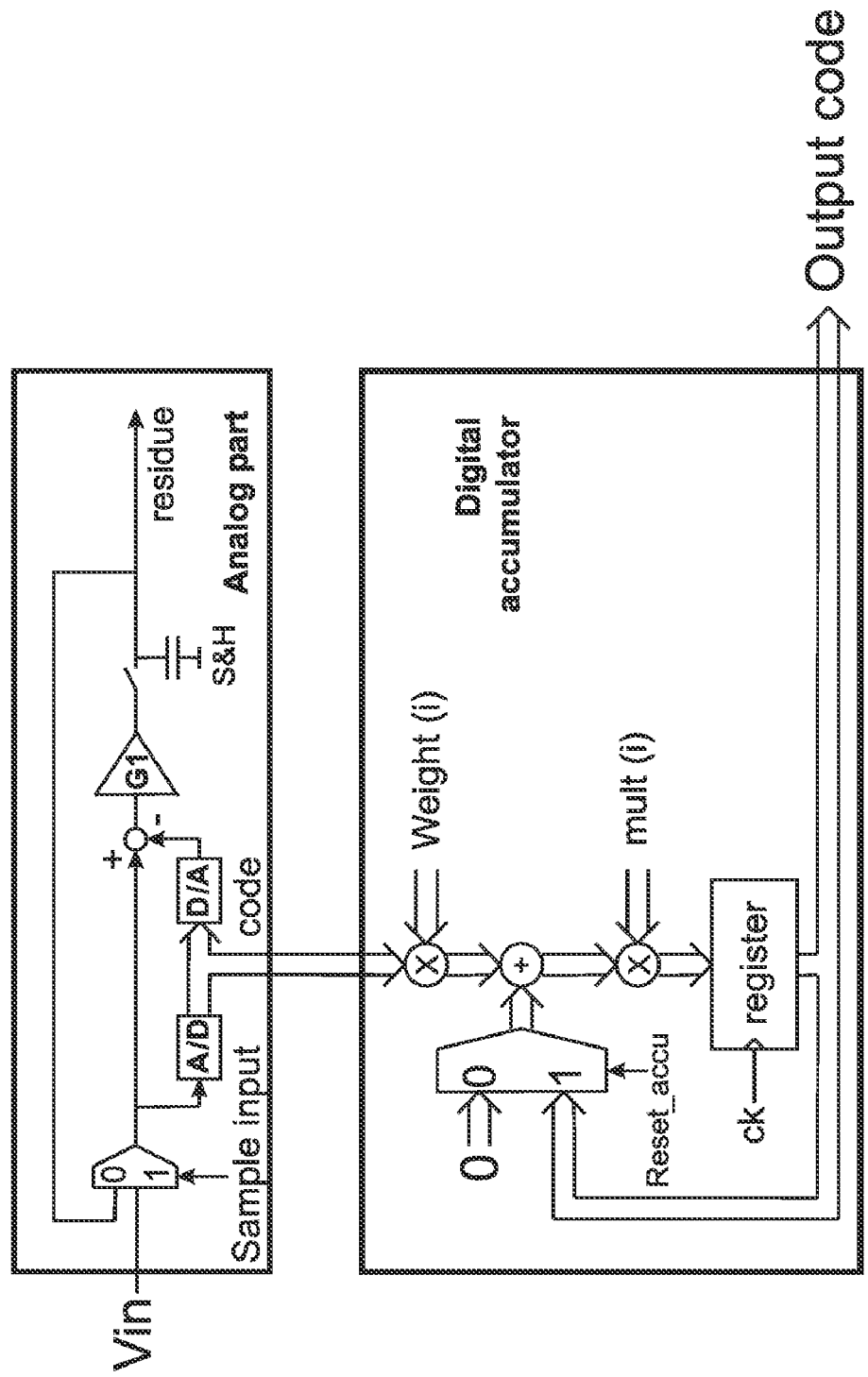
FIG. 12 represents schematically an algorithmic ADC including one successive approximation stage.

When the different steps can also be performed by the same analogue stage, sequentially in time, the converter is called an algorithmic ADC, as illustrated in FIG. 12. The structure is similar to that of a pipeline stage except that a multiplexer is added at the input of the block so that the effective input of the block is either the real input of the block when the input signal is sampled, or the residue of the stage calculated at the previous step, in order to refine the signal estimation. The different bits or codes obtained successively in the different steps must then be accumulated properly with proper weights. As these weights generally correspond to powers of 2, the corresponding digital multiplications generally reduce to simple shifts. In fact, the multiplication by the weight in front of the accumulation loop is generally replaced by a multiplication within the accumulation loop. The multiplication factor in this case corresponds to the ratio of weights of two successive codes.

Figure 13:
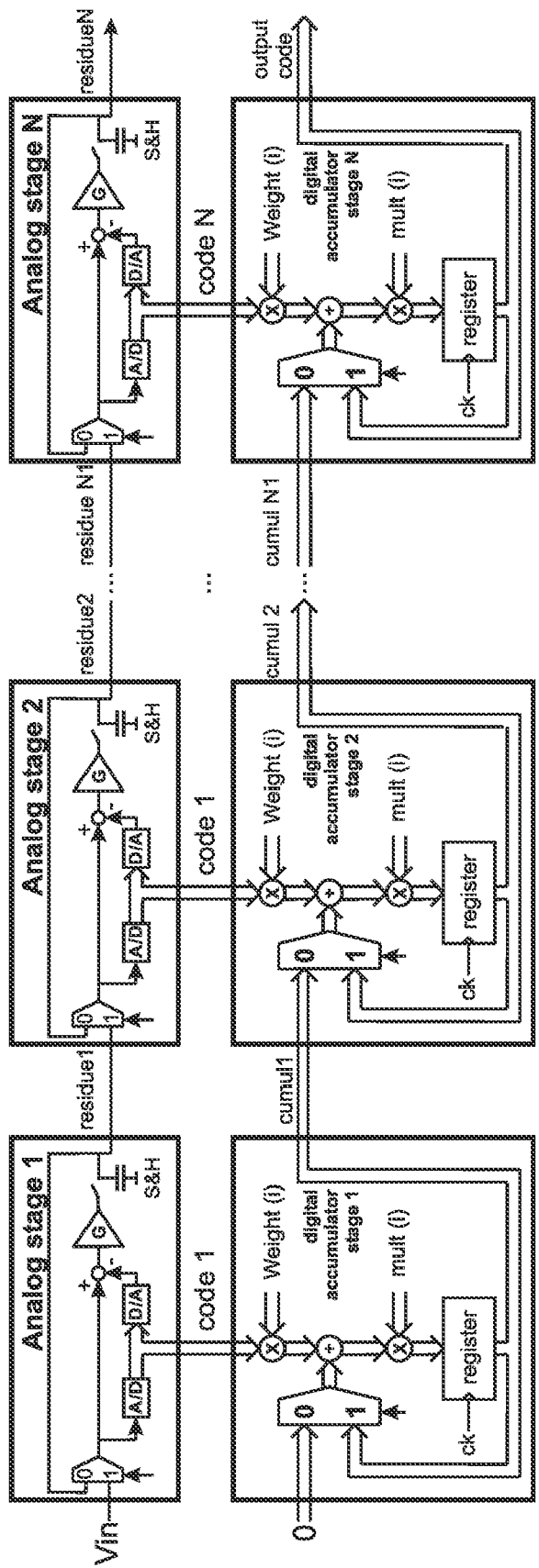
FIG. 13 represents a combined ADC architecture including successive approximation stages.

Finally, both approaches can be combined by cascading two or more stages, each stage being an algorithmic ADC (FIG. 13). In this case, each stage performs several steps of the conversion and then passes the residue to the next stage for processing of the next steps. A similar process occurs in the digital part. A first accumulator accumulates the bits for the first stage and then transfers the result to the accumulator of the second stage, and so on.

Figure 14:
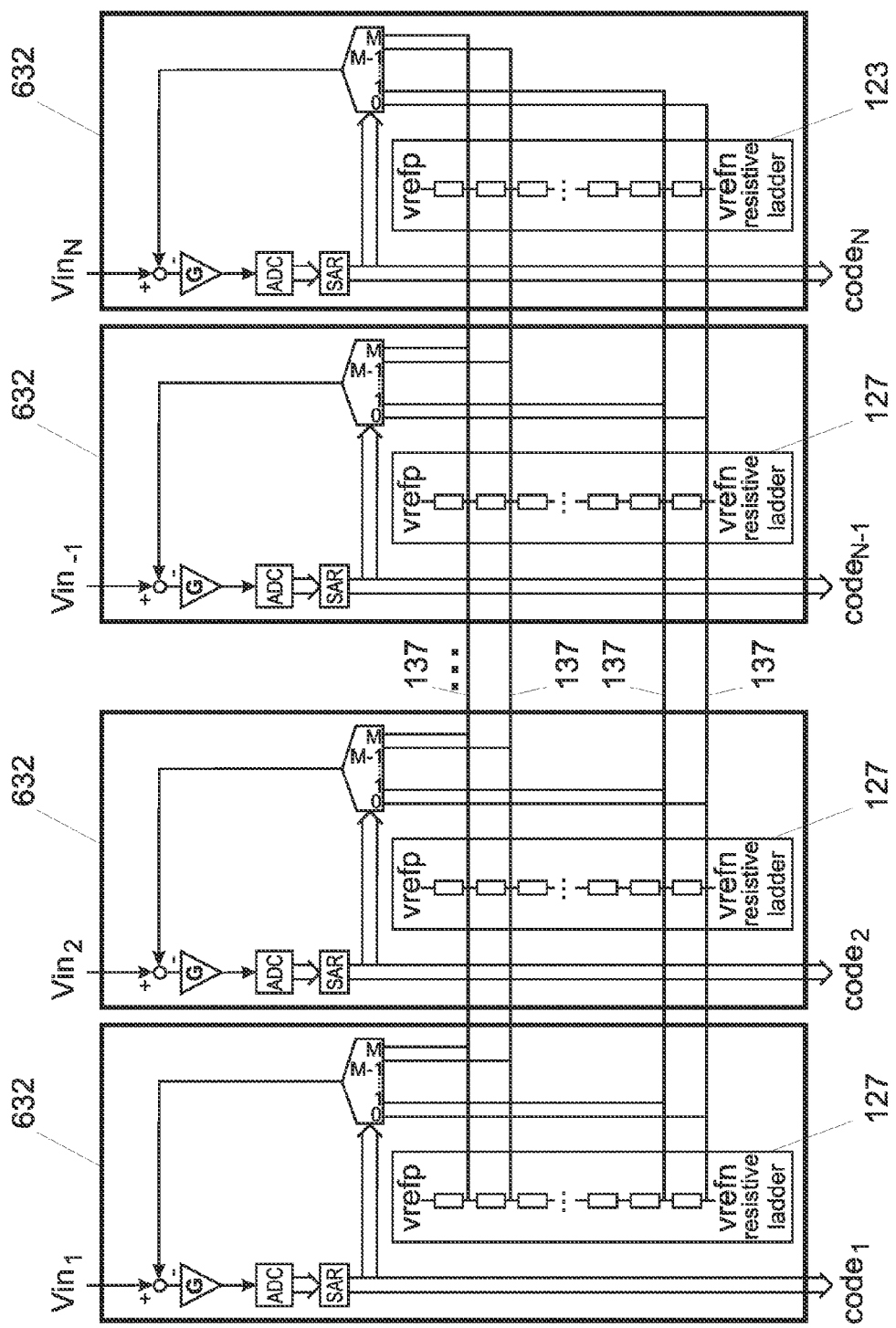
FIGS. 14 and 15 illustrate schematically two variant readout interface circuits according to aspects of the present invention.

According to an aspect of the invention illustrated by FIG. 14, a X-ray readout system comprises a bank of successive approximation ADCs 632, each of them is arranged to read sequentially a subset of the detector's pixels, for example a column of pixels. Individual ADC include a feedback DAC in each channel which is realized by selecting taps from a resistive ladder 127 as previously shown in FIG. 7. Each channel includes its own resistive divider and multiplexer. The DAC in the feedback path of each ADC is thus based on a thermometric principle and intrinsically guarantees a monotonic conversion and a very low differential nonlinearity.

In the embodiment of the invention represented on FIG. 14, the corresponding taps of the resistive ladders 127 different channels are interconnected by a low resistance paths 137, so that the same reference levels are seen by all the channels, and in particular by adjacent channels. Doing so, not only the non linearity of the resistive dividers of the different channels is averaged but, importantly, the integral non linearity is the same for all the channels. Therefore the readout system exhibits its excellent spatial linearity.

Figure 15:
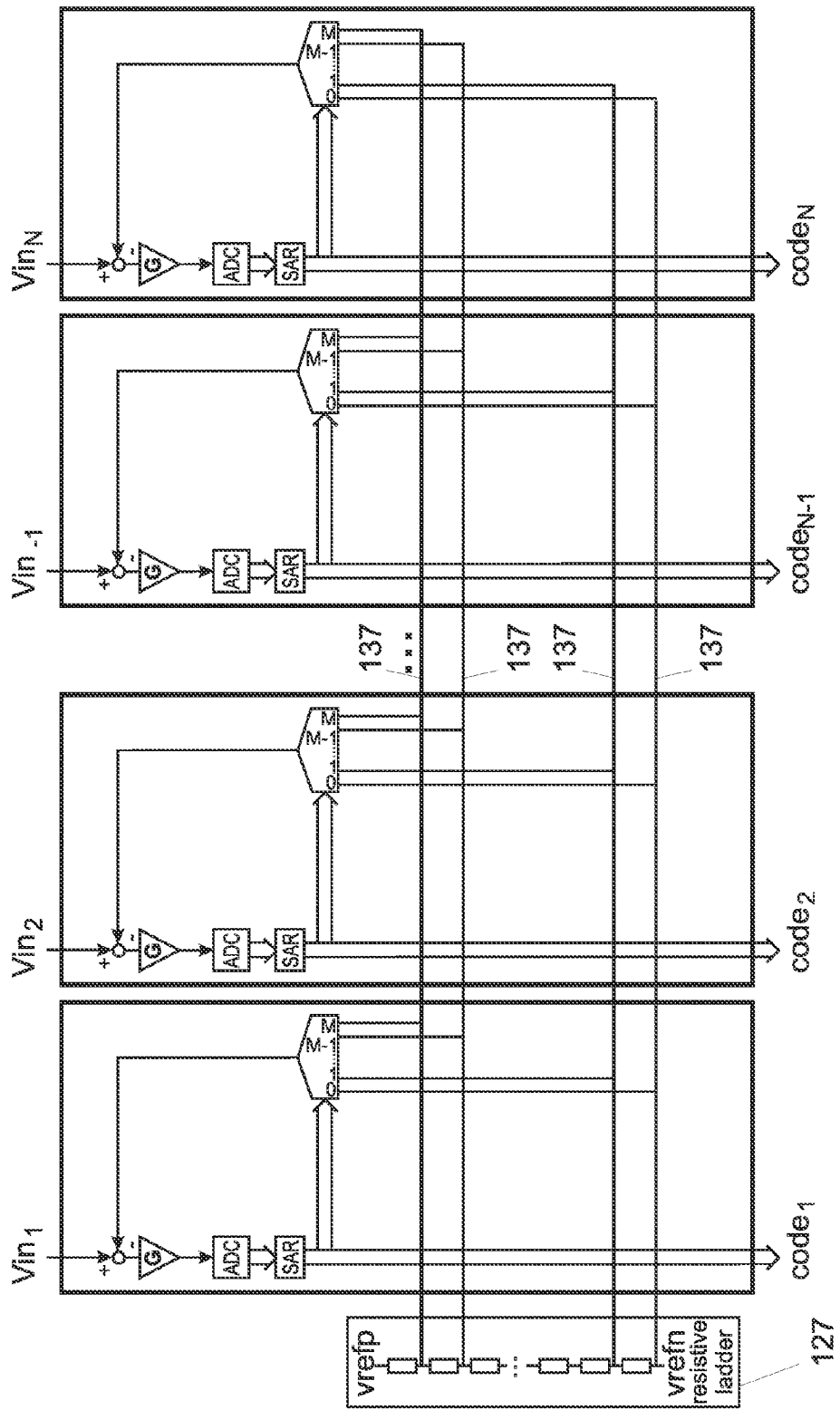

Looking at FIG. 14, one can consider that the interconnected resistive dividers within each channel constitute a single global resistive divider, so this solution is equivalent to the embodiment of FIG. 15 where only a single resistive ladder 127 is present.

Figure 16:
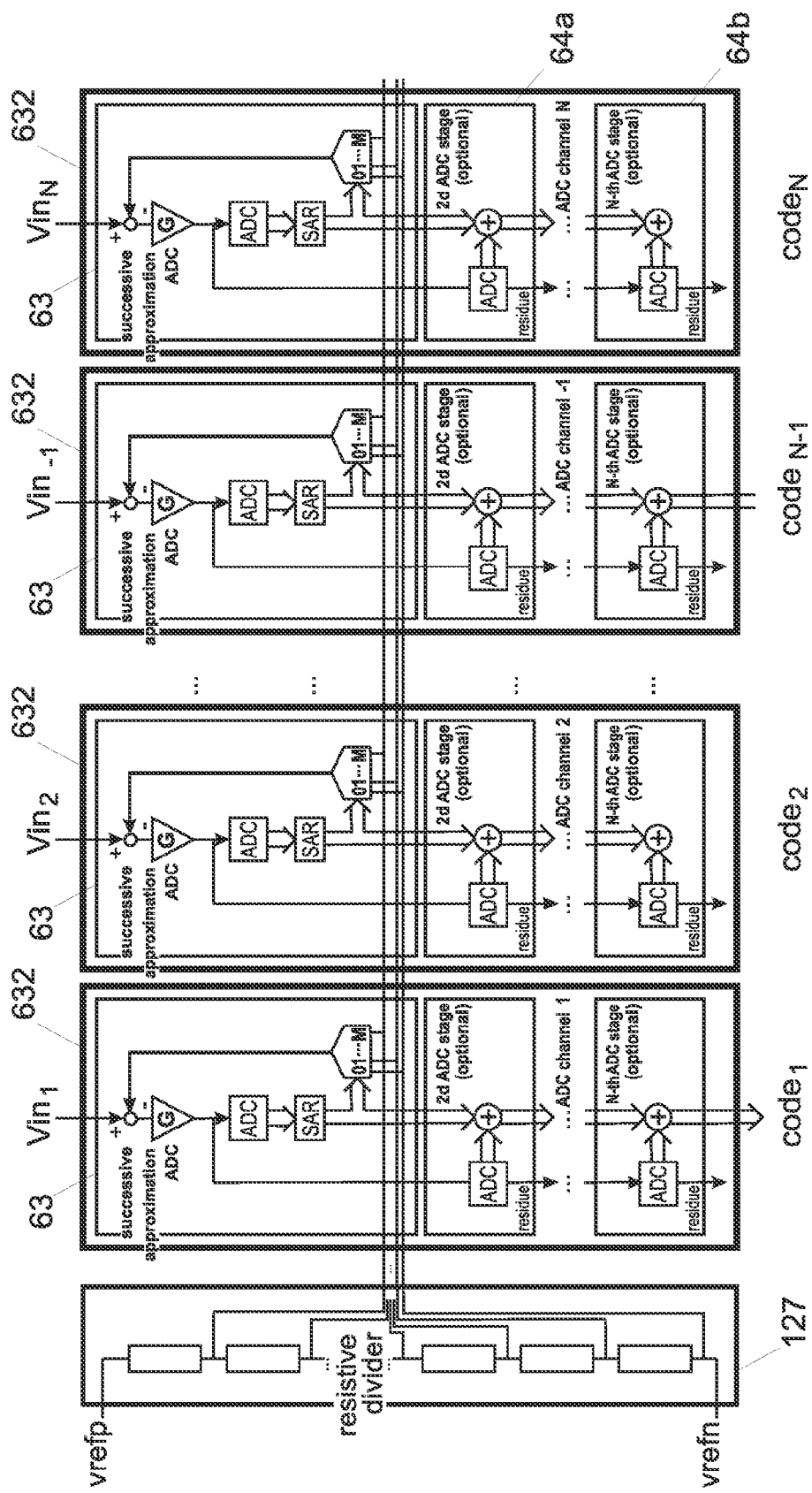
FIG. 16 shows schematically a possible disposition for a readout system according to the present invention.

FIG. 16 represents a possible disposition for a readout system according to the present invention in which the converters 632 of individual channels comprise a successive approximation ADC 63 with a DAC in feedback that refers to a resistive ladder 127 that is shared between a plurality of channels, and in which the successive approximation ADCs 63 are arranged to generate a residue signal, available to successive digitizers 64a, 64b, for improving the overall resolution. The benefit of this structure is that the non linearity of each channel is basically dominated by that one of the resistive divider (feedback path of the first stage), which is common to all the channels. By this fact, the spatial non linearity is significantly improved.

What is claimed is:

1. A readout circuit for an X-ray pixel detector, the readout circuit comprising:
   a plurality of analogue front-end circuits (631, 15), each of them adapted to read an analogue X-ray exposure value from a pixel (25) of the pixel detector;
   a plurality of channels including successive approximation ADCs (632, 621, 17), each analogue front-end circuit (631, 15) having an output connected to an ADCs, each ADC being arranged to provided a digital value indicative of the X-ray exposure value of a pixel
   characterized in that
   each of the ADCs has a feedback loop comprising a DAC (12, 126), the readout circuit comprising a voltage reference unit providing a plurality of reference voltages to the DACs of several ADCs of said plurality of ADCs.

2. The readout circuit of the claim 1, wherein the voltage reference unit is a resistive ladder (121, 127).

3. The readout circuit of the claim 2, wherein the DACs are thermometer-coded DACs.

4. The readout circuit of the claim 2, wherein the reference unit provides a series of evenly-spaced voltages (tab0_tab(N-1)).

5. The readout circuit of the claim 4, wherein the DACs are thermometer-coded DACs.

6. The readout circuit of the claim 1, wherein the DACs are thermometer-coded DACs.

7. The readout circuit of the claims 1, wherein the reference unit provides a series of evenly-spaced voltages (tab0_tab(N-1)).

8. The readout circuit of the claim 1, wherein the DAC (126) within each channel is a multiplexer selecting voltage values provided by the voltage reference unit according to a digital code (123).

9. The readout circuit of the claim 1, wherein the reference unit includes one reference ladder that is in common between the channels and having a plurality of taps, the reference voltages being present at the taps.

10. The readout circuit of the claim 1, wherein the channels includes each a resistive ladder (127) having a plurality of taps, the corresponding taps of different resistive ladders (127) in different channels being connected by a low-resistance path (137), the different resistive ladders thus interconnected composing the voltage reference unit.

11. The readout circuit of the claim 1, wherein the successive approximation ADCs are arranged to generate a residue signal which is encoded by one or several further ADC stages.

12. An integrated circuit containing the readout circuit of the claim 1.

* * * * *